Aug. 17, 1965 J. R. LOUIS 3,201,672
PULSATING D.-C. BIAS CIRCUIT FOR TRANSISTORIZED SERVO AMPLIFIER
Filed May 23, 1960
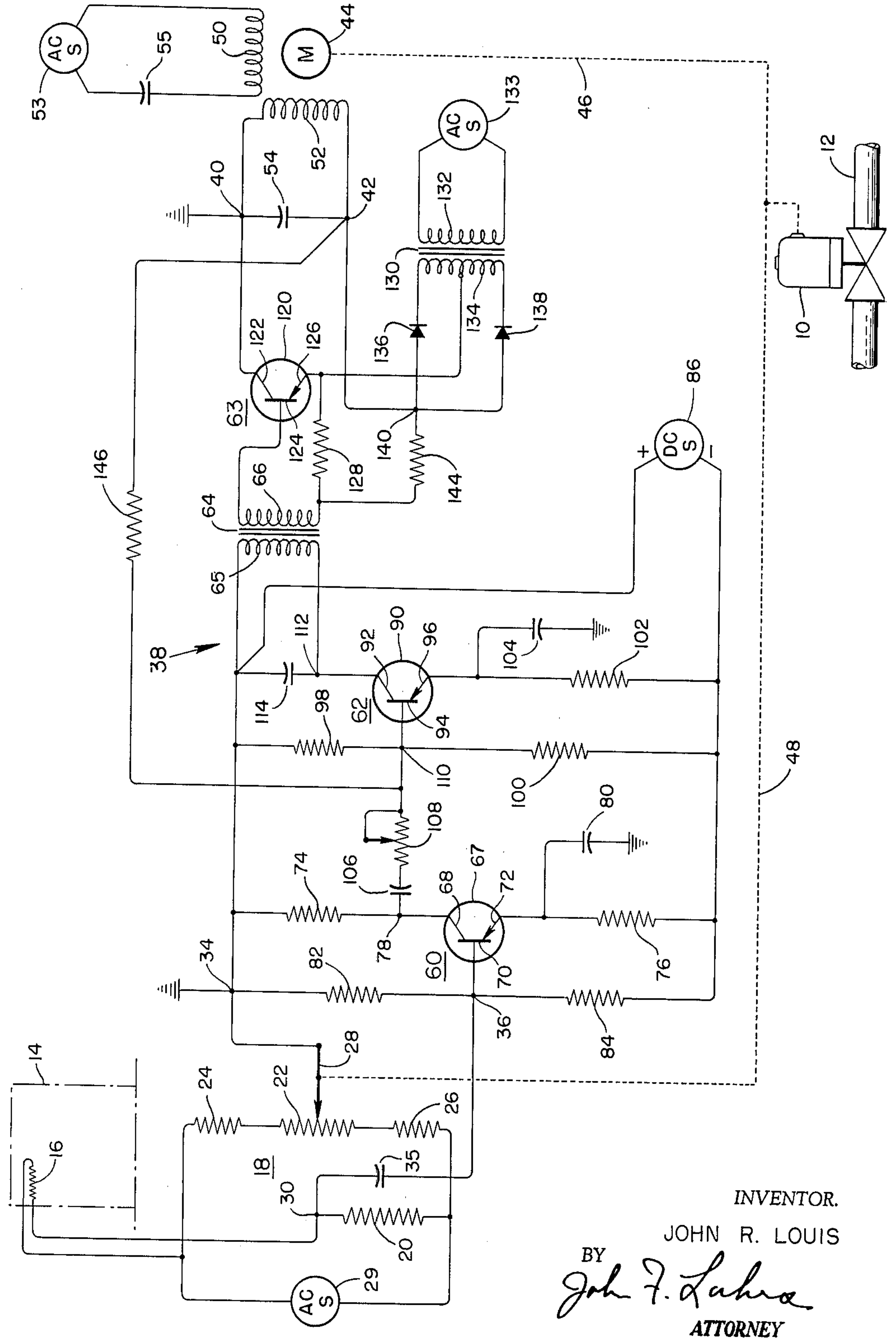
INVENTOR.
JOHN R. LOUIS
BY
ATTORNEY

3,201,672
PULSATING D.-C. BIAS CIRCUIT FOR TRANSISTORIZED SERVO AMPLIFIER

John R. Louis, Cleveland, Ohio, assignor to Bailey Meter Company, a corporation of Delaware Filed May 23, 1960, Ser. No. 30,885
5 Claims. (Cl. 318—207)

This invention relates to electronic amplifying circuits and more particularly to an improved A.-C. servo amplifier for a process control system.

Heretofore, electronic amplifiers have been employed in process control systems for amplifying an electric signal representative of the deviation of a variable from a predetermined set point and for positioning a final control element in accordance with the magnitude and direction of deviation of the signal. Many different types of electronic amplifiers employing electric vacuum tubes have been available in the past for operating in this manner. However, with the growing demand for increased reliability of such power amplifiers, the more recent electronic amplifier circuits employ electric transistors in place of the well-known vacuum tubes.

The problems connected with the design of a transistor amplifier differ substantially from those connected with the design of a vacuum tube amplifier. As generally known, the operation of the transistor is effected by its temperature rise due to the heating effect of an electric current conducted thereby. Conditions such as "thermal runaway" are often encountered wherein the transistor becomes substantially uncontrollable destroying the accuracy of the amplifier circuit.

This unstable operation of the transistor during this temperature condition has in the past been prevented by the provision for compensating circuits in the output stage of the amplifier circuit. These circuits, however, are generally complicated and cause the total cost of the transistor amplifier to be substantially higher than the total cost of an equivalent vacuum tube amplifier. Thus, any increased reliability arising out of the use of transistors in a process control amplifier is obtained by sacrificing economy.

It is a principal object of my invention to render an electronic transistor amplifier substantially unaffected by temperature variations caused by the heating effect of electric currents without the provision of additional circuit components or compensating circuitry.

Another object of the invention is to provide an improved A.-C. transistor amplifier circuit having maximum gain and substantially unaffected by the heating effect of the transistor current.

Still another object of the invention is to provide an improved method of biasing a transistor amplifier stage.

Other objects and advantages will become apparent from the following description taken in connection with the accompanying drawing which is a schematic illustration of an amplifier circuit for a process control system embodying my invention.

In a preferred embodiment of the invention an output stage of an A.-C. servo amplifier is formed by a transistor having a high power rating with respect to the power output requirements of the amplifier circuit to cause the transistor to operate at a power output condition which is a small percentage of its power output rating. The output stage is biased by an unfiltered full wave rectified 60 cycle A.-C. signal which provides the minimum necessary D.-C. bias at any point in the cycle of an alternating input signal to the stage to establish steady state conduction. At low magnitudes of the alternating input signal the stage operates as a Class A amplifier and at higher magnitudes operates as a Class AB amplifier. With this condition of operation of the transistor and the method of bias provided, only slight negligible variations in the alternating output signal are encountered as a result of temperature increases due to the heating effect of the transistor current.

Referring to the drawing, there is shown a single element control system comprising a valve 10 effective to vary the flow rate of a fluid in a conduit 12 in accordance with variations in temperature of a heated zone 14 as sensed by a temperature responsive resistance element 16.

The resistance element 16 forms one variable resistance arm of an A.-C. energized bridge circuit 18 having a second arm formed by a resistance 20 and third and fourth bridge arms formed by a slidewire resistance 22 together with calibrating resistances 24 and 26. The slidewire resistance 22 is provided with a movable contact arm 28 which may be positioned to apportion the resistance 22 between adjacent arms of the bridge 18 and to provide a means for balancing the bridge circuit in response to an unbalanced condition caused by variation in the resistance of element 16.

The bridge circuit 18 is energized by a suitable source of alternating voltage 29 connected across one diagonal of the bridge. The bridge output or unbalance voltage appearing across the opposite diagonal (contact arm 28 and terminal 30) is applied through a coupling capacitor 35 to the input terminals 34 and 36 of an A.-C. amplifier 38 the output terminals 40 and 42 of which are connected to an energizing circuit for an electric motor 44. The motor 44 is effective through drive linkage 46 to position the valve 10 to vary the flow rate in conduit 12 and effective through linkage 48 to position the contact arm 28.

In operation of the system thus far described, the bridge circuit 18 operates in a well-known manner producing an alternating potential between movable contact arms 28 and 30 in response to a variation in the resistance value of the temperature responsive element 16, the magnitude and phase of the potential being proportional to the direction and magnitude of the temperature change sensed by resistance element 16. This potential is applied to the input terminals 34 and 36 of amplifier 38 which establishes a proportional amplified output potential at terminals 40 and 42. The motor 44 is thus positioned in a direction corresponding to the phase of the potential to position the valve 10. As the motor 44 positions valve 10 contact arm 28 is simultaneously positioned to balance the bridge 18 and reduce the potential at input terminals 34 and 36 to zero. When bridge balance is achieved rotation of motor 44 and positioning of valve 10 ceases.

The motor 44 is provided with the usual energizing windings 50 and 52 arranged to have a 90° phase relationship. The winding 50 is provided with a series tuned energizing circuit including a source of alternating voltage 53 and a serially connected capacitor 55. The winding 52 is provided with a parallel tuned energizing circuit including a capacitor 54 coupled to the output terminals 40 and 42. When the output potential at terminals 40 and 42 is of one phase due to unbalance of bridge 18, a 90° phase relationship will exist between windings 50 and 52 causing rotation of the motor 44 in one direction. If bridge unbalance should occur in the other direction the phase of the potential at terminals 40 and 42 will shift by 180° reversing the 90° phase relationship between the windings 50 and 52 and causing rotation of the motor 44 in the opposite direction.

To reduce the power output required by amplifier 38 to a minimum value the total power input required to rotate motor 44 is apportioned between windings 50 and 52 with a ratio of approximately 3 to 1. The winding 50 is preferably supplied with a wattage input approximately equal to three-fourths of the total necessary power input to motor 44 thereby rendering it necessary for the amplifier circuit 38 to provide only approximately one-fourth of the necessary power input to motor 44 through winding 52. This feature is utilized to advantage in design of the output stage of amplifier 38 as will later be described.

Referring now more particularly to amplifier 38, this circuit comprises an input amplifying stage 60, a second stage 62 and an output stage 63. The stages 60 and 62 form a two stage pre-amplifier circuit which is inductively coupled to the output stage 63 by means of a transformer 64 having a primary winding 65 and a secondary winding 66.

The first stage 60 comprises a P-N-P transistor 67 having a collector 68, a base 70 and emitter 72 and provided with the usual collector and emitter resistances 74 and 76 respectively, the output potential of the stage 60 being developed at a terminal 78 in the collector circuit. An emitter by-pass capacitor 80 is connected between the emitter 72 and ground to complete the emitter and collector circuits.

The first stage 60 is provided with a D.-C. forward bias sufficient to maintain steady state conduction of the transistor 67 to provide a constant D.-C. potential at terminal 78. The necessary negative potential of the base 70 with respect to the emitter 72 is established by a D.-C. voltage source 86, and a pair of biasing resistors 82 and 84 forming a voltage divider network in the input circuit. With this circuit arrangement a constant direct potential will be produced at terminal 78 even when the input to the stage 60 is zero. If an alternating input potential is applied to terminals 34 and 36 the forward bias of transistor 67 will vary to produce a pulsating D.-C. potential at terminal 78.

The second stage 62 is similar in circuitry to the stage 60 having a P-N-P transistor 90 provided with a collector 92, a base 94 and an emitter 96. The second stage 62 is also biased by source 86 to provide steady state conduction and is provided with biasing resistors 98 and 100, an emitter resistance 102 and an emitter by-pass capacitor 104.

The output terminal 78 of stage 60 is connected by a coupling capacitor 106 and gain control potentiometer 108 to the input terminal 110 of the second stage 62. As will be apparent to those skilled in the art such a coupling capacitor is effective to block the steady state direct potential produced at terminal 78 and to only pass the pulsating potential produced by unbalance of bridge 18 to the input terminal 110 of the second stage 62. The potentiometer 108 may be adjusted as desired to control the gain of the first stage 60.

The second stage 62 operates similar to the stage 60 to produce an amplified pulsating potential at an output terminal 112 in response to the application of a pulsating input potential to the terminal 110. The output potential of the second stage 62 is applied to the primary winding 65 of coupling transformer 64 to produce a pulsating potential across the secondary winding 66 and establish an input potential to the output stage 63. The primary winding of transformer 64 is tuned to parallel resonance by means of a capacitor 114 to provide a minimum load impedance for the second stage 62.

The output stage 63 comprises a P-N-P transistor 120 having a collector 122, a base 124 and an emitter 126, the base and emitter electrodes being connected in series with a resistor 128 across secondary winding 66. D.-C. bias for the output stage 63 is provided by a transformer 130 having a primary winding 132, a secondary winding 134, and energized by an alternating voltage source 133. A center tap of secondary winding 134 is connected to the emitter 126 while the opposite ends of the secondary winding are connected through a pair of diode rectifiers 136 and 138 respectively to a terminal 140 which is connected to output terminal 42 and through a resistor 144 to one side of resistor 128. With this arrangement an unfiltered full wave rectified D.-C. signal is produced at terminal 140 and utilized to provide the minimum necessary D.-C. bias as will be later described in more detail.

To complete the circuitry of the output stage 63, the collector 122 is electrically connected to output terminal 40. Output terminal 42 is connected by a resistor 146 to the input terminal 110 of the second stage to establish negative feedback from the amplifier output to the input of the second stage 62 which lowers the output impedance of stage 63.

As previously mentioned due to the occurrence of conditions such as "thermal runaway," transistor amplifiers have in the past been provided with compensating circuits in the output stage to insure proper functioning and stable operation of the amplifier. The circuitry and components employed in the output stage 63 produces a stage amplifier output even under adverse temperature conditions and the need for a compensating circuit is eliminated.

To eliminate the need for temperature compensation, the transistor 120 is preferably of a type having a high power rating in the order of approximately 25 times the maximum power input to be supplied to motor winding 52. As a result even at maximum output signal conditions of amplifier 38 the transistor 120 only produces a small percentage of its rated power output. During this low power output operation, only very slight temperature rises of the transistor 120 are encountered and resulting variations in the output potential at terminals 40 and 42 are negligible.

The low power output and low temperature operation of the transistor 120 is facilitated by providing for a minimum D.-C. forward bias in the output stage 63. More particularly, it was previously mentioned that an unfiltered full wave rectified D.-C. bias signal was produced at terminal 140. The bias potential at terminal 140 is preferably in phase with (or 180° out of phase with) the alternating input signal produced across the secondary winding 66 of coupling transformer 64 to cause the peak voltages of the two signals to occur simultaneously with respect to time. This in effect produces steady state conduction of transistor 120. However, the bias potential varies with the sinusoidal input potential and at any instant is only of sufficient magnitude to maintain steady state conduction.

As a result of this particular biasing method, the output stage 63 in response to an input signal across the secondary winding of transformer 66 of small magnitude will operate as a class A amplifier producing a sinusoidal voltage across motor winding 52. However, if the alternating input voltage is of high magnitude, the peak magnitude of the input potential will exceed the peak forward bias potential causing the output stage 64 to operate as a Class AB amplifier producing the characteristic Class AB wave form across winding 52.

The output stage 63 in effect operates as an electronic switch to control rotation of the motor 44. Assuming that motor 44 comprises a 60 cycle A.-C. motor and that the voltage sources 29 and 133 are 60 cycle alternating voltages, the unfiltered full wave rectified bias signal appearing at terminal 140 and causing steady state conduction will have a frequency of 120 cycles. In the absence of an A.-C. input potential to stage 63 the 120 cycle circulating current caused by steady state conduction under the influence of the bias potential at terminal 140 will not have the proper frequency to cause rotation of the motor 44. When an alternating input potential appears across secondary winding 66, however, a 60 cycle current will flow through winding 52 causing rotation of motor 44 in a direction depending on the phase of the alternating input potential and thus the direction of unbalance of bridge circuit 18.

The advantages of the output stage 63 will now be apparent. By arranging the windings of motor 44 so that the required power input to winding 52 is only approximately one third of that required for winding 50 and by using a transistor having a high power rating, the transistor 120 will produce a power output which is only a small percentage of its rated power output. This arrangement together with the particular biasing circuit disclosed which produces minimum bias at substantially any point in time or the alternating input signal results in the operating temperature of the transistor being maintained at a substantially lower than normal value rendering the output stage 63 substantially unaffected by temperature conditions and eliminating the need for a compensating circuit.

The use of a transistor in the output stage 63 having a high power rating also produces a low amplifier output impedance with respect to the impedance of motor winding 52 producing maximum motor torque. The lower amplifier output impedance thus achieved also results from the transistor 120 being operated at a low power output condition with respect to its total power output rating. At this low power output condition the impedance of the transistor 120 is low with respect to the circuit resistance.

The particular method of operating the transistor 120 also results in an output amplifying stage having the maximum available gain. In addition to the stable amplifier output obtained by operating the transistor 120 at a small percentage of its rated power output, I have also found that maximum gain is obtained at this condition of operation when the stage 63 is biased in the particular manner disclosed. By comparison the gain of the stage 63 has been found to be considerably higher than the gain of a conventional output stage in which a transistor is operated at its rated power output.

It will be apparent to those skilled in the art that the invention is not limited in scope to the particular circuitry disclosed and described nor to any particular values of the circuit components illustrated. However, for purposes of illustration and not of limitation the particular circuit disclosed was found to operate satisfactory with circuit components of the following values and sizes:

| | |
|---|---|
| Transistor **67** | 2N466. |
| Transistor **90** | 2N466. |
| Transistor **120** | 2N376A. |
| Resistor **82** | 10,000 ohms. |
| Resistor **84** | 30,000 ohms. |
| Resistor **74** | 1,500 ohms. |
| Resistor **76** | 7,500 ohms. |
| Resistor **98** | 10,000 ohms. |
| Resistor **100** | 3,300 ohms. |
| Resistor **102** | 2,400 ohms. |
| Resistor **128** | 270 ohms. |
| Resistor **144** | 300 ohms. |
| Resistor **146** | 1,000,000 ohms. |
| Potentiometer **108** | 250,000 ohms. |
| Capacitor **35** | 100 mfd. |
| Capacitor **106** | 10 mfd. |
| Capacitor **80** | 2,000 mfd. |
| Capacitor **114** | 0.1 mfd. |
| Capacitor **104** | 500 mfd. |
| Capacitor **52** | 0.75 mfd. |
| Capacitor **54** | 100 mfd. |
| Transformer **64** | Turns ratio 6400 to 200. |
| Transformer **130** | Power transformer (24 volt secondary with center tap). |
| Diode **136** | Type 1488. |
| Diode **138** | Type 1488. |
| Motor **44** | 9 watt, 60 cycle A.-C. |
| Winding **50** | 6.75 watts 4,000 ohms. |
| Winding **52** | 2.25 watts 178 ohms. |
| Power supply **86** | 20 volts D.-C. |
| Power supply **133** | 117 volts A.-C., 60 cycle. |
| Power supply **53** | 117 volts A.-C., 60 cycle. |
| Power supply **29** | 117 volts A.-C., 60 cycle. |

The manufacturer's power output rating of a 2N376A transistor is approximately 25 watts. In the circuit disclosed this transistor is operated at approximately one watt or at approximately 4% of its rated capacity. To provide the necessary 10 watt power input to the motor 44, the circuit for motor 44 was arranged to produce approximately 6.75 watts across winding 50 leaving the remaining 2.25 watts to be supplied to winding 52 and thus establishing the 3 to 1 ratio of power input to windings 50 and 52 previously described. With this circuit approximately 1.25 watts of the required 2.25 watts is supplied by the bias voltage in the output stage 63 leaving one watt to be supplied by the transistor 120.

The operation of the stage 63 has for purposes of illustration been disclosed in connection with an alternating input signal having a sinusoidal wave form. However, as will readily be apparent to those skilled in the art, the stage 63 can be readily applied to the amplification of signals having other wave forms such as a square wave alternating output signal of a mechanical D.-C. to A.-C. converter. Thus, the stage 63 if desired can be utilized in combination with a D.-C. to A.-C. converting means to effect amplification of direct voltage signals.

While only one embodiment of the invention has been herein shown and described, it will be apparent to those skilled in the art that many changes will be made in the construction and arrangement of parts without departing from the scope of the invention as defined in the appended claims.

What I claim as new and desire to secure by Letters Patent of the United States is:

1. A control circuit, comprising:
a transistor having first, second and third electrodes;
a pulsating direct current bias supply;
an alternating current input circuit producing an input signal varying in synchronism with and at a frequency one-half that of the pulsating direct current connected in series with said bias supply and the first and second electrodes of said transistor; and
an output circuit having an output impedance connected in series with said bias supply and the second and third electrodes of said transistor.

2. A motor control circuit, comprising:
a transistor having first, second and third electrodes;
a reversible induction motor having a control winding and a power winding;
a pulsating direct current bias supply;
an input circuit producing an input signal varying in synchronism with and at a frequency one-half that of the pulsating direct current and having a transformer connected in series with said bias supply and the first and second electrodes of said transistor; and
an output circuit including the control winding of said motor in series with said bias supply and the second and third electrodes of said transistor.

3. A motor control circuit, comprising:
a transistor having a base, emitter and collector electrodes;
a reversible induction motor having a control winding and a power winding and means for controlling the phase of the current in said control winding relative to the phase of the current in said power winding to thereby control the direction of rotation of said motor comprising,
a source of pulsating direct current;
means connecting said pulsating direct current source and the control winding of said motor in a series circuit including the collector and emitter electrodes of said transistor; and
a phase reversible alternating current signal source producing an input signal varying in synchronism with and at one-half the frequency of said pulsating direct current source connected in a series circuit with said source of pulsating direct current and the base and emitter electrodes of said transistor.

4. A motor control circuit as set forth in claim 3 wherein the energizing frequency of said motor and the frequency of said alternating current signal source is 60 cycles and the frequency of the pulsating direct current is 120 cycles.

5. In a control system, the combination comprising:

a two phase reversible induction motor having a control winding and a power winding;

an energizing circuit connecting said power winding to an A.-C. source;

an alternating current amplifier having an input circuit adapted to receive a variable alternating input signal;

a transformer having a primary and secondary winding, said primary winding connected to the output of said alternating current amplifier;

a transistor having a base electrode connected to the secondary winding of said transformer, a collector electrode connected to the control winding of said motor and an emitter electrode;

a source of pulsating direct current connected in series with the control winding of said motor and the collector and emitter electrodes of said transistor; and a second source of pulsating direct current connected in series with the secondary winding of said transformer between the base electrode and emitter electrode of said transistor.

References Cited by the Examiner

UNITED STATES PATENTS

| | | | |
|---|---|---|---|
| 2,440,600 | 4/48 | Crosby | 318—207 |
| 2,527,718 | 10/50 | Grass | 318—207 |
| 2,544,790 | 3/51 | Hornfeck | 318—29 |
| 2,770,764 | 11/56 | McAdie et al. | 318—207 |
| 2,774,021 | 12/56 | Ehret | 318—207 |
| 2,832,924 | 4/58 | Cilyo | 318—28 X |
| 2,872,595 | 2/59 | Pinckaers | 307—88.5 |
| 2,887,642 | 5/59 | Ehret et al. | 318—29 X |
| 2,889,507 | 6/59 | Kennedy et al. | 318—29 |
| 2,897,379 | 7/59 | Hinsdale | 307—88.5 |

OTHER REFERENCES

Terman, F. E.: Electronic and Radio Engineering, 4th edition, McGraw-Hill, New York, 1955.

JOHN F. COUCH, *Primary Examiner.*

MILTON O. HIRSHFIELD, ORIS L. RADER, *Examiners.*